United States Patent
Yang et al.

(10) Patent No.: US 7,063,938 B2
(45) Date of Patent: Jun. 20, 2006

(54) METHOD OF PREPARING PATTERNED COLLOIDAL CRYSTALS

(75) Inventors: Seung-Man Yang, Daejeon (KR); Ki-Ra Yi, Gyeonggi-do (KR); Yong-Hak Park, Busan (KR); Sarah Kim, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 146 days.

(21) Appl. No.: 10/662,088

(22) Filed: Sep. 12, 2003

(65) Prior Publication Data

US 2004/0146811 A1    Jul. 29, 2004

(30) Foreign Application Priority Data

Jan. 23, 2003    (KR) .................... 10-2003-0004638

(51) Int. Cl.
*G03F 7/00* (2006.01)
*B01J 13/00* (2006.01)

(52) U.S. Cl. .................. 430/322; 430/270.1; 430/394; 516/98

(58) Field of Classification Search ............ 430/270.1, 430/322, 394; 516/98
See application file for complete search history.

(56) References Cited

U.S. PATENT DOCUMENTS

| 4,522,910 | A | * | 6/1985 | Hallman ................ 430/157 |
| 5,332,651 | A | * | 7/1994 | Dickinson et al. ....... 430/270.1 |
| 2002/0143073 | A1 | * | 10/2002 | Jiang et al. .............. 516/98 |

* cited by examiner

*Primary Examiner*—Nicole Barreca
(74) *Attorney, Agent, or Firm*—Martine Penilla & Gencarella LLP

(57) ABSTRACT

A method of preparing patterned colloidal crystals includes filling a monomer solution in the interstices between particles of planar colloidal crystals for photopolymerization inside them, and performing a selective photopolymerization process between the colloidal crystals using a mask. In one exemplary method, a first monomer solution for photopolymerization is filled inside planar colloidal crystals. A first selective photopolymerization process is performed inside the colloidal crystals using a mask. A second monomer solution for photopolymerization is filled into the firstly patterned colloidal crystals. At least one additional photopolymerization process is performed inside the firstly patterned colloidal crystals using an additional mask. Through this method, colloidal crystalline regions oriented in the same direction with different refractive indexes can be controlled in a level of μm. Further, repeated patterns can be inexpensively and easily prepared.

12 Claims, 4 Drawing Sheets

(a)

(b)

(c)

(a)

(b)

(c)

(d)

METHOD OF PREPARING PATTERNED COLLOIDAL CRYSTALS

BACKGROUND OF THE INVENTION

1. Field of the Invention

The present invention pertains, in general, to preparation methods of colloidal crystals used as device materials in optical communication fields, and more specifically, to a method of preparing colloidal crystals for use in manufacturing reflective-mode microdisplays requiring a high efficiency of color display, characterized by forming patterns of photonic crystals including patterns of the crystals with feature size ranged from tens of to hundreds of μm.

2. Description of the Related Art

Generally, colloidal crystals are structured materials in which uniform polymer or inorganic microspheres are arranged into ordered crystalline structure. As such, the crystalline structure resulting from self-organization is face-centered cubic. When the lattice constant of colloidal crystals is the order of the wavelength of light, light within a specific wavelength cannot penetrate but reflected completely by the colloidal crystals. Thus, since the colloidal crystals affect the transmission of light, they are referred to as photonic crystals. At present, many efforts have been made to commercialize the photonic crystals. In this regard, bulk shapes of the colloidal crystals should be controlled to manufacture optical devices, such as optical waveguide or lens.

For patterning of the colloidal photonic crystals, that is, for preparation of patterned photonic crystals in which alternating regions with different photonic band gaps are periodically arranged in the size of tens to hundreds of μm, there is disclosed a method of filling the first particles in microchannels and further filling the second particles each having a different size from that of the first particles between the microchannels (S. M. Yang, H. Miguez, G. A. Ozin, Advanced Functional Materials, 2002, 12, 425). However, this method is disadvantageous in terms of difficulty in repeatedly performing a coating process under complicated conditions. Also, it is impossible to apply the above method to a large area.

In addition, there is proposed a method of patterning a surface and selectively coating particles, by use of a self-assembled monolayer, (Z. -Z. Gu, A. Fujishima, O. Sato, Angew. Chem. Int. Ed. 2002, 41, 2067). But, by the above method, it is difficult to coat multi-layered particles to obtain the desired photonic band gaps. Further, a method of filling the multi-layered particles on previously made patterns is disclosed (S. M. Yang, G. A. Ozin, Chem. Commun. 2000, 2507), but is disadvantageous in terms of selective filling of the particles.

SUMMARY OF THE INVENTION

Therefore, it is an aspect of the present invention to alleviate the problems encountered in the related art and to provide a method of preparing finely patterned colloidal crystals having a uniform thickness, by selective polymerization of a polymer.

Another aspect of the present invention is to provide a method of preparing patterned colloidal crystals, by subjecting the finely patterned colloidal crystals to a further selective patterning process.

According to a first embodiment of the present invention to achieve the above aspects, there is provided a method of preparing patterned colloidal crystals, including the steps of filling a monomer solution for photopolymerization at the interstices between the building block spheres of planar colloidal crystals, and performing a selective photopolymerization process inside the colloidal crystals by use of a mask.

According to a second embodiment of the present invention, there is provided a method of preparing patterned colloidal crystals, including the steps of filling a first monomer solution for photopolymerization inside planar colloidal crystals, performing a first selective photopolymerization process inside the colloidal crystals by use of a mask, and filling a second monomer solution for photopolymerization inside firstly patterned colloidal crystals, followed by further performing at least one photopolymerization process inside the firstly patterned colloidal crystals by use of an additional mask.

In the present invention, the feature sizes of the patterns in photonic crystals constituting the patterns can be freely controlled at tens of μm. In addition, a patterning process can be easily performed on a large area, therefore resulting in the preparation of variously patterned photonic crystals useful in industrial fields of displays, optical communications, etc.

Thereby, not only more simplified two-dimensional patterns but also complicated two- or three-dimensional patterns can be obtained.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
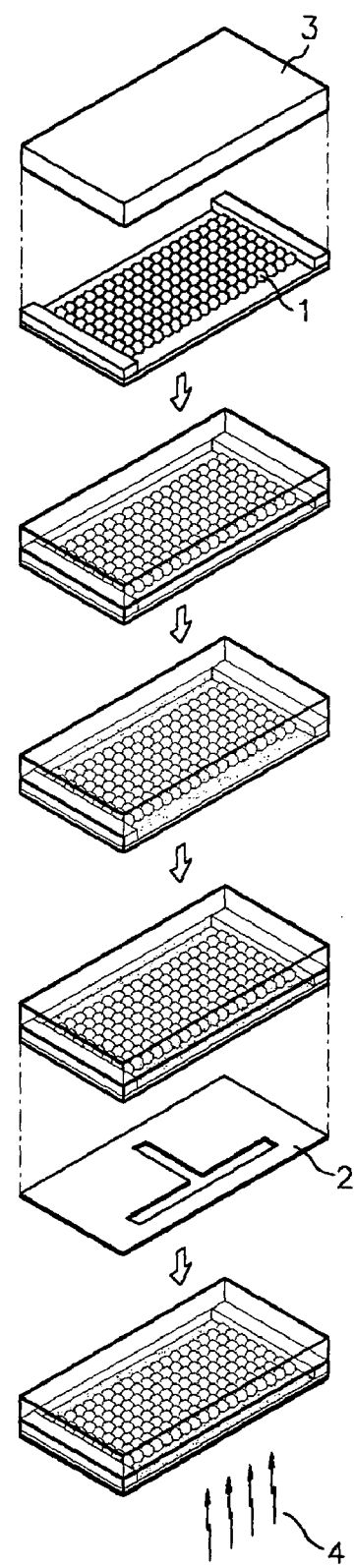
FIG. 1 schematically shows a selective photopolymerization process used in the present invention.

Referring to FIG. 1, there is illustrated a process of forming two-dimensionally patterned crystals by use of a selective photopolymerization device. The device includes planar colloidal crystals 1 formed on a glass substrate, a mask 2 attached to a lower surface of the glass substrate for two-dimensional patterning, a cover 3 for supporting a photoinitiator-containing monomer solution for use in the photopolymerization by capillary force, and a filter 4 for selecting light of the desired wavelength. In addition, the device is preferably provided with a magnification lens and a displaying portion to observe the polymerization process.

The planar colloidal crystals 1 are formed according to various methods, for example, a vertical dipcoating method performed on a flat transparent substrate, by use of a suspension containing a polymer and/or inorganic particles with uniform size (P. Jiang, J. F. Bertone, K. S. Hwang, V. L. Colvin, Chem. Mater. 11, 1999, 2132).

The polymer is exemplified by a material capable of being crystallized through self-assembly of a solvent that is evaporated, and is not particularly limited so long as being industrially useful. Usable particles include organic homopolymers, such as polystyrene, polymethyl methacrylate, polyphenyl methacrylate, polyacrylate, polyalphamethylstyrene, poly1-methylcyclohexyl methacrylate, polycyclohexyl methacrylate, polybenzyl methacrylate, polychlorobenzyl methacrylate, poly1-phenylcyclohexyl methacrylate, poly1-phenylethyl methacrylate, polyperfuryl methacrylate, poly1,2-diphenylethyl methacrylate, polypentabromophenyl methacrylate, polydiphenylmethyl methacrylate and polypentachlorophenyl methacrylate; organic copolymers, such as methylmethacrylate-benzylmethacrylate copolymer, styrene-acrylonitrile copolymer, MMA-TFEMA (2,2,2-trifluoroethylmethacrylate) copolymer, MMA-PFPMA (2,2,3,3,3-pentafluoropropylmethacrylate) copolymer, MMA-HFIMA (1,1,1,3,3,3-hexafluoroisomethacrylate) copolymer, MMA-HFBMA (2,2,3,3,4,4,4-heptafluorobutylmethacrylate) copolymer, TFEMA-PFPMA copolymer, TFEMA-HFIMA copolymer, styrene-methylmethacrylate (SM) copolymer, and TFEMA-HFBMA copolymer.

Examples of inorganic particle materials include $SiO_2$, $TiO_2$, ZnS, $ZnO_2$, and $Fe_3O_4$.

A solvent used for the crystallization by self-assembly is preferably selected from among materials in which particles could be stable by electrostatic or steric repulsion. Such a solvent is exemplified by water, ethanol for electrostatic repulsive particles, toluene, Tetrahydrofuran and polydimenthyl siloxane, and their mixtures for steric repulsive particles.

The evaporation of the solvent is performed at temperatures lower than a boiling point thereof. As the evaporation rate of the solvent is faster, a time required for forming photonic crystals on the surface of the solvent is shortened. However, an evaporation rate that is too high results in defective crystals. In the present invention, optimal evaporation conditions for the crystallization depend on the kinds of the particles and solvent used, which may be easily selected by those skilled in the art. The thickness of the planar colloidal crystals is directly proportional to the evaporation rate of the solvent, the concentration of the colloidal solution, and the contact angle between the solvent and the plane, while being inversely proportional to the drawing speed of the plane.

Although being not particularly limited, the transparent substrate includes glass, polymers, ITO-coated glass, etc.

As shown in FIG. 1, the planar colloidal crystals 1 are covered with a silicone cover 3, and a photoinitiator-containing monomer solution for the polymerization is filled between the crystals 1 and the cover 3.

The monomer suitable for the photopolymerization includes at least one ethylenically-unsaturated double bond, while having various molecular weights, and may undergo addition-polymerization. The 'monomer' includes oligomer, also.

The preferable monomer includes an acrylate monomer, which is exemplified by hydrophilic monomers, such as dimethacryalte, hydroxypropyl methacryalte, hydroxyethyl methacryalte (HEMA), or methacryalte, derived from reactive methacryalte, as well as diglycidyl ether of bisphenol A (BISGMA).

The above monomer has mono-, di-, or poly-methacrylate (bis-acrylate and bis-methacrylate of polyethylene glycol having a molecular weight of 200–500), such as methyl methacrylate, ethyl methacrylate, isopropyl methacrylate, n-hexyl methacrylate, stearyl methacrylate, allyl methacrylate, glycerol dimethacrylate, glycerol trimethacrylate, ethylene glycol dimethacrylate, diethylene glycol dimethacrylate, triethylene glycol dimethacrylate, diethylene glycol dimethacrylate, triethyleneglycol dimethacrylate, 1,3-propanediol dimethacrylate, trimethylolpropane trimethacrylate, 1,2,4-butanetriol trimethacrylate, 1,4-cyclohexanediol diacrylate, pentaerythritol tetramethacrylate, sorbitol hexamethacrylate, bis-[1-(2-acryloxy)]-p-ethoxyphenyldimethyl methane, bis[1-(3-acryloxy-2-hydroxy)]-p-propoxyphenyldimethylmethane, trihydroxyethyl-isocyanurate trimethacrylate, copolymerizable mixtures of acrylated monomers disclosed in U.S. Pat. No. 4,652,274, and acrylated oligomers disclosed in U.S. Pat. No. 4,642,126, unsaturated amides, such as methylene bis-acrylamide, methylene bis-methacrylamide, 1,6-hexamethylene bis-acrylamide, diethylene triamine tris-acrylamide and beta-methacrylaminoethyl methancrylate, and vinyl compounds, such as styrene, diallyl phthalate, divinyl succinate, divinyl adipate and divinyl phthalate.

The monomer solution may include one monomer or mixtures of two or more monomers.

The mask 2 suitable for use in the patterning is attached to opposite to the surface of the substrate formed with the colloidal crystals 1, to which light of a desired wavelength is selectively irradiated, thereby causing the photopolymerization only in the particular crystalline regions. As such, unpolymerized regions are removed by being dissolved in an ethanol solvent.

The mask 2 is not particularly limited, and preferably is made by a high-resolution printer having the resolution to the extent of 10 μm, for example, Lintronic printer or Linitype-Hell, on a transparent film.

The photoinitiator necessary for the photopolymerization should absorb light between ultraviolet (UV) ranges and visible ranges of 400–700 nm, or infrared ranges of 700–1100 nm.

As such, the photoinitiator when being used in the visible ranges includes a sensitizer, and an electron donor.

A UV absorbing initiator is exemplified by acetophenone compounds, benzoinether compounds, benzophenone compounds, phosphineoxide compounds, etc., and specifically, carbonyl compounds, such as benzoin, benzoinmethylether, benzoinethylether, benzoinisopropylether, acetoin, butyroin, toluoin, benzyl, benzophenone, p-methoxybenzophenone, dietoxyacetophenone, α,α-dimethoxy-α-phenylacetophenone, methylphenylglyoxylate, ethylphenylglyoxylate, 4,4'-bis(dimethylaminobenzophenone), and 2-hydroxy-2-methyl-1-phenylpropan-1-one, sulfur compounds, such as 1-hydroxycyclohexylphenylketone, tetramethyltiuram monosulfide, and tetramethyltiuram disulfide, azo compounds, such as azobisisobutyronitrile, and azobis-2,4-dimethylvalero, peroxide compounds, such as benzoyl peroxide and di-tert-butyl peroxide.

The useful sensitizer should be soluble in the monomer, and absorb light at a suitable wavelength. In addition, preferable is the sensitizer capable of conferring photosensitivity to 2-methyl-4,5-bis(trichloromethyl)-s-triazine, according to the test procedure disclosed in U.S. Pat. No. 3,729,313. Further, the sensitizer should have shelf stability for necessary times.

The preferable sensitizer includes compounds in the following categories:

Ketones, coumarin dyes (e.g., keto-coumarins), xantene dyes, acridine dyes, thiazole dyes, thiazine dyes, oxazine dyes, azine dyes, aminoketone dyes, porphyrins, aromatic polycyclic hydrocarbonds, p-substituted aminostyryl ketone compounds, aminotriaryl methanes, merocyanines, squarylium dyes and pyridinium dyes, ketones (e.g., monoketones or alpha-diketones), ketocoumarins, aminoarylketones and p-substituted aminostyryl ketone compounds. For applications requiring high photosensitivity, it is preferred to employ a sensitizer containing a julolidinyl moiety. For applications requiring a deep cure (e.g., where coated or reinforced fibers weaken similar wavelength of radiation), it is preferred to employ sensitizers having an extinction coefficient below 1000, more preferably below 100, at the desired wavelength of irradiation for the photopolymerization.

For instance, a preferable class of ketone sensitizers has the following Formular:

ACO(X)$_b$B

Wherein,

X is CO or CR$^1$R$^2$, R$^1$ and R$^2$ can be the same or different, each represents hydrogen, alkyl, alkaryl, or aralkyl; b is 1 or 0; A and B can be the same or different, substituted (having one or more non-interfering substituents) or unsubstituted aryl, alkyl, alkaryl, or aralkyl, or A and B together can form a cyclic structure, including substituted or unsubstituted alicyclic, aromatic, heteroaromatic or fused aromatic ring.

Ketone compounds suitable for the above Formula include monoketone (b=0), for example, 2,2-, 4,4- or 2,4-dihydroxybenzophenone, di-2-pyriketone, di-2-furanyl ketone, di-2-thiophenyl ketone, benzoin, fluorone, quinone, for example, chloroquinone, 2-aza-3-carboxy-9-fluorone, chalcone, Michler's ketone, 2-fluoro-9-fluorone, 2-chlorothioxantone, acetophenone, benzophenone, 1- or 2-acetonaphtone, 9-acetylanthracene, 2-, 3- or 9-acetylphenanthrene, 4-acetylbiphenyl, propiophenone, n-butyrophenone, valerophenone, 2-, 3- or 4-acetylpyridine, or 3-acetyl coumarine. Suitable diketone includes aralkyl diketone, such as anthraquinone, penanthrenquinone, o-, m- and p-diacetylbenzene, 1,3-, 1,4-, 1,5-, 1,6-, 1,7- and 1,8-diacetylnaphthalene, 1,5-, 1,8- and 9,10-diacetylanthracene. Suitable α-diketone (b=1, X=CO) includes 2,3-butanedione, 2,3-pentanedione, 2,3-hexanedione, 3,4-hexanedione, 2,3-heptanedione, 3,4-heptanedione, 2,3-octanedione, 4,5-octanedione, benzyl, 2,2'-, 3,3'- and 4,4'-dihydroxybenzyl, furyl, di-3,3'-indolylethanedione, 2,3-bornanedione (camphorquinone), 1,2-cyclohexanedione, 1,2-naphthaquinone, acenaphthaquinone, etc.

The other preferable sensitizer includes Rose Bengale, fluorescein, Eosin Yellow, Eosin Y, Ethyl Eosin, Eosin Bluish, Erythrosin Yellowish Blend, and 4',5'-dibromofluorescein.

The electron donor may be widely used, and should be soluble in the monomer and have superior shelf stability. The donor functions to increase the speed of the cure or depth of the cure of a composition, when being exposed to light of a desired wavelength. The donor has an oxidation potential that is greater than zero, and is less than or equal to the oxidation potential of p-dimethoxybenzene. The oxidation potential is between about 0.5 and 1 versus a saturated calomel electrode (S.C.E.), and may be experimentally measured or obtained from references, such as N. L. Weinburg [Technique of Electroorganic Synthesis Part II Techniques of Chemistry, Vol. V(1975)].

The preferable donor includes amines (including aminoaldehydes and aminosilanes), amides (including phosphoramides), ethers (including thioethers), ureas (including thioureas), ferrocene, sulfinic acids and salts thereof, salts of ferrocyanide, ascorbic acid and salts thereof, dithiocarbamic acid and salts thereof, salts of xantate, salts of ethylene diamine tetraacetic acid and salts of tetraphenylboronic acid. The donor may be unsubstituted or substituted with one or more non-interfering substituents. In particular, the preferable donor includes an electron donor atom, such as nitrogen, oxygen, phosphor or sulfur, and an abstractable hydrogen atom bonded to a carbon or silicon atom alpha to the electron donor atom.

The preferable amine donor includes alkyl-, aryl-, alkaryl- and aralkyl-amines, such as methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethylaminopentanol and p-N-dimethylaminobenzonitrile; aminoaldehydes, such as p-N,N-dimethylaminobenzaldehyde, p-N,N-diethylaminobenzaldehyde, 9-julolidinecarboxaldehyde and 4-morpholinobenzaldehyde; and aminosilanes, such as trimethylsilylmorpholine, trimethylsilylpiperidine, bis(dimethylamino)diphenylsilane, tris(dimethylamino)methylsilane, N,N-diethylamino trimethylsilane, tris(dimethylamino)phenylsilane, tris(methylsilyl)amine, tris(dimethylsilyl)amine, bis(dimethylsilyl)amine, N,N-bis(dimethylsilyl)aniline, N-phenyl-N-dimethylsilylaniline and N,N-dimethyl-N-dimethylsilylamine. Tertiary aromatic alkylamines, in particular, those having one or more electron-withdrawing groups on the aromatic ring, have been found to provide superior shelf stability, which can result from the use of amines that are solid at room temperature.

The preferable amide donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide and tripiperidinophosphine oxide.

The preferable ether donor compounds include 4,4'-dimethoxybiphenyl, 1,2,4-trimethoxybenzene and 1,2,4,5-tetramethoxybenzene.

The preferable urea donor compounds include N,N'-dimethylurea, N,N-dimethylurea, N',N'-diphenylurea, tetramethylthiourea, tetraethylthiourea, tetra-n-butylthiourea, N,N-di-n-butylthiourea, N,N'-di-n-butylthiourea, N,N-diphenylthiourea and N,N'-diphenyl-N,N'-diethylthiourea.

In the present invention, a photoinitiator system for use in the photopolymerization includes a ternary system disclosed in U.S. Pat. No. 5,545,676. In such a ternary system, a third component is diaryliodonium or sulfonium salt, in audition to the sensitizer and the electron donor as first and second components, respectively. The above salt should be soluble in the monomer, and preferably is shelf-stable when dissolved therein in the presence of the sensitizer and electron donor. Thus, selection of a particular iodonium or sulfonium salt may depend to some extent on the particular monomer, sensitizer and donor chosen. The ternary system should include the three components, but further include one or more sensitizers or electron donors if desired.

Useful salts are disclosed in U.S. Pat. Nos. 3,729,313, 3,741,769, 3,808,006, 4,250,053 and 4,394,403.

The preferable iodonium salt includes diphenyliodonium chloride, diphenyliodonium hexafluorophosphate and diphenyliodonium tetrafluoroborate.

The useful sulfonium complex salt is substituted with one or more aromatic groups, and preferably, three aromatic groups. A representative group is an aromatic group having 4–20 carbons, and selected from among phenyl, thienyl and furanyl group. These aromatic groups may have selectively one or more fused benzo groups (e.g., naphthyl, etc.; benzothienyl, dibenzothienyl; benzofuranyl, dibenzofuranyl, etc.). Such aromatic groups may be substituted by at least one group, below, or other groups essentially unreactive with other components present on a specific composition in which the complex salt is used: halogen, nitro, aryl, ester, sulfoester, amido, carbamyl, sulfamyl, alkoxy, aryl, alkyl, aryloxy, alkylsulfonyl, arylsulfonyl, perfluoroalkyl and perfluoroalkylsulfonyl.

The preferable aromatic sulfonium complex salt includes triphenylsulfonium tetrafluoroborate, methyldiphenylsulfonium tetrafluoroborate, dimethylphenylsulfonium hexafluorophosphate, triphenylsulfonium hexafluorophosphate, triphenylsulfonium hexafluoroantimonate, 4-butoxyphenyl-diphenylsulfonium tetrafluoroborate, 4-chlorophenyldiphenylsulfonium hexafluoroantimonate, tris(4-phenoxyphenyl) sulfonium hexafluorophosphate, di(4-ethoxyphenyl) methylsulfonium hexafluoroarcenate, 4-acetamidophenyldiphenylsulfonium tetrafluoroborate, dimethylnaphthylsulfonium hexafluorophosphate, trifluoromethyldiphenylsulfonium tetrafluoroborate, methyl(N-methylphenothiazinyl)sulfonium hexafluoroantimonate, phenylmethylbenzylsulfonium hexafluorophosphate, 10-methylphenoxantinium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, and 5-methyl-10,10-dioxothianthrenium hexafluorophosphate.

The preferable salt is triaryl-substituted salts, such as triphenylsulfonium hexafluorophosphate. The triaryl-substituted salts are higher in thermal stability than that of mono- and di-aryl-substituted salts, and thus may be applied to a curable system requiring a long storage life. The triaryl-substituted complex salt is more suitable for photosensitizing the dye used in the present invention.

Figure 2:
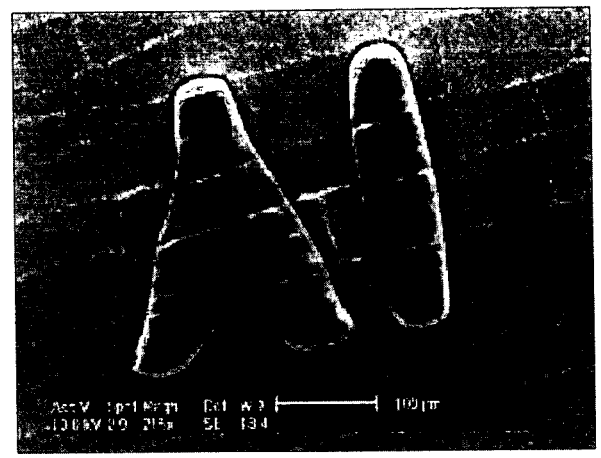
FIGS. 2a, 2b and 2c are scanning electron micrographs of patterned colloidal crystals, prepared by use of a monomer solution to be polymerized by absorbing ultraviolet rays.
Figure 2:
Figure 2:
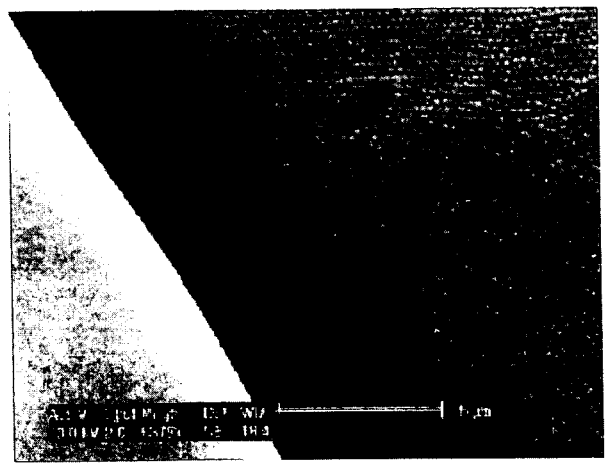
Figure 3:
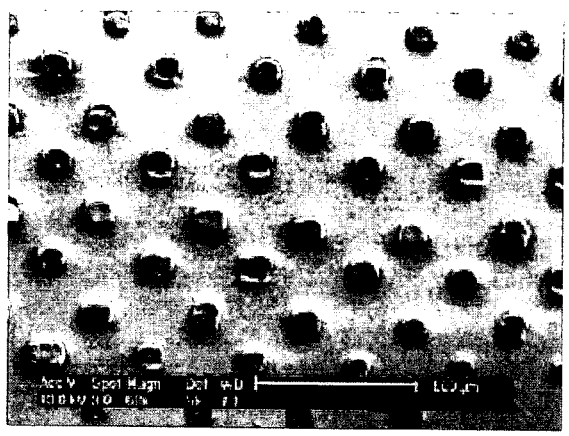
FIGS. 3a and 3c are scanning electron micrographs of patterned colloidal crystals.
FIG. 3b is an optical micrograph of the patterned colloidal crystals.
FIG. 3d is a photograph showing the thickness of the colloidal crystals in which an inserted image shows a two-dimensional Fourier transform for the crystals.
Figure 3:
Figure 3:
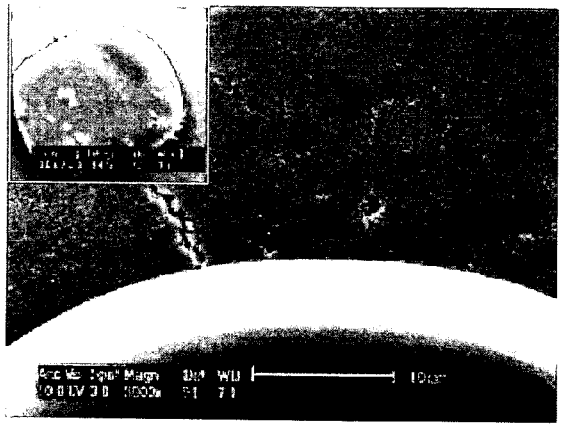
Figure 3:
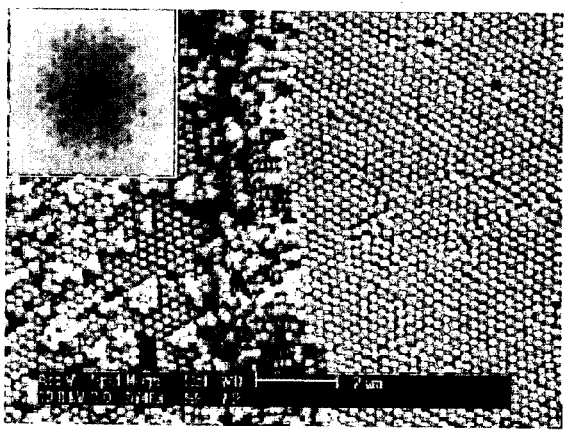

To perform the polymerization of the polymer filled between the colloidal crystals, a material inducing the polymerization by absorbing light near the infrared rays or visible light of a high wavelength is used, which is favorable in terms of the formation of fine patterns. FIGS. 2a, 2b and 2c show electron micrographs (215, 750 and 6879 magnifications) of patterned colloidal crystals polymerized by absorbing UV rays of 200–300 nm. FIGS. 3a and 3c show electron micrographs of patterned colloidal crystals polymerized by absorbing visible light of 400–600 nm, and FIG. 3b shows an optical micrograph of the above patterned colloidal crystals. From this, it can be found that crystals polymerized by absorbing light near the infrared rays or visible light of a high wavelength can be more finely patterned.

Having generally described this invention, a further understanding can be obtained by reference to certain specific examples which are provided herein for purposes of illustration only and are not intended to be limiting unless otherwise specified. Accordingly, the photopolymerization materials having optimal conditions required for obtaining desired pattern sizes or refractive index of polymers may be freely selected by those skilled in the art.

EXAMPLE 1

Preparation of 100 μm×100 μm Square Patterned Colloidal Crystals

A mask having 100 μm×100 μm square patterns was used. As planar colloidal crystals, a glass substrate on which an organic material was completely removed by a Piranha solution of sulfuric acid and hydrogen peroxide was dipped into an aqueous solution having 1 wt % of 230 nm sized silica particles, and then drawn at a rate of 0.02 μm/sec, to form a crystalline structure comprising ten-layered silica particles. Both ends of the glass substrate were wound by a 60 μm thick polyimide tape as a spacer so as not to bring crosslinked (or cured) PDMS (PolyDiMethylSiloxane) rubber into direct contact with the colloidal crystals.

Then, a monomer solution for the photopolymerization was filled between the glass substrate having colloidal crystals and a cover of crosslinked PDMS rubber. As such, the monomer solution was composed of 0.1 wt % of 4-7-diiodo-3-butoxy-6-fluorone as a fluorine dye inducing the photopolymerization by absorbing light of 400–600 nm to transfer energy of the absorbed light to an photoinitiator, 5 wt % of amine acrylate initiating the polymerization by donating an electron to form a radical, 0.15 wt % of (4-octyloxyphenyl)phenyldiphenyliodonium hexafluoroantimonate (OPPI) serving to prevent the bleaching of the dye and to aid the photopolymerization, and 94.75 wt % of alkoxylated trifunctional acrylate ester as a monomer.

On a microscope equipped with a mercury lamp and a fluorescent filter, a preparative sample was placed, after which the size and position of a focal point of the microscope were set to a region of the sample to be polymerized, by use of an optical filter acting to pass light of 400–600 nm therethrough. Then, light required for the polymerization was irradiated (30 sec–1 min), to complete the polymerization. Thereafter, the PDMS cover was removed and an unpolymerized region was dissolved in ethanol, and removed.

Figure 4:
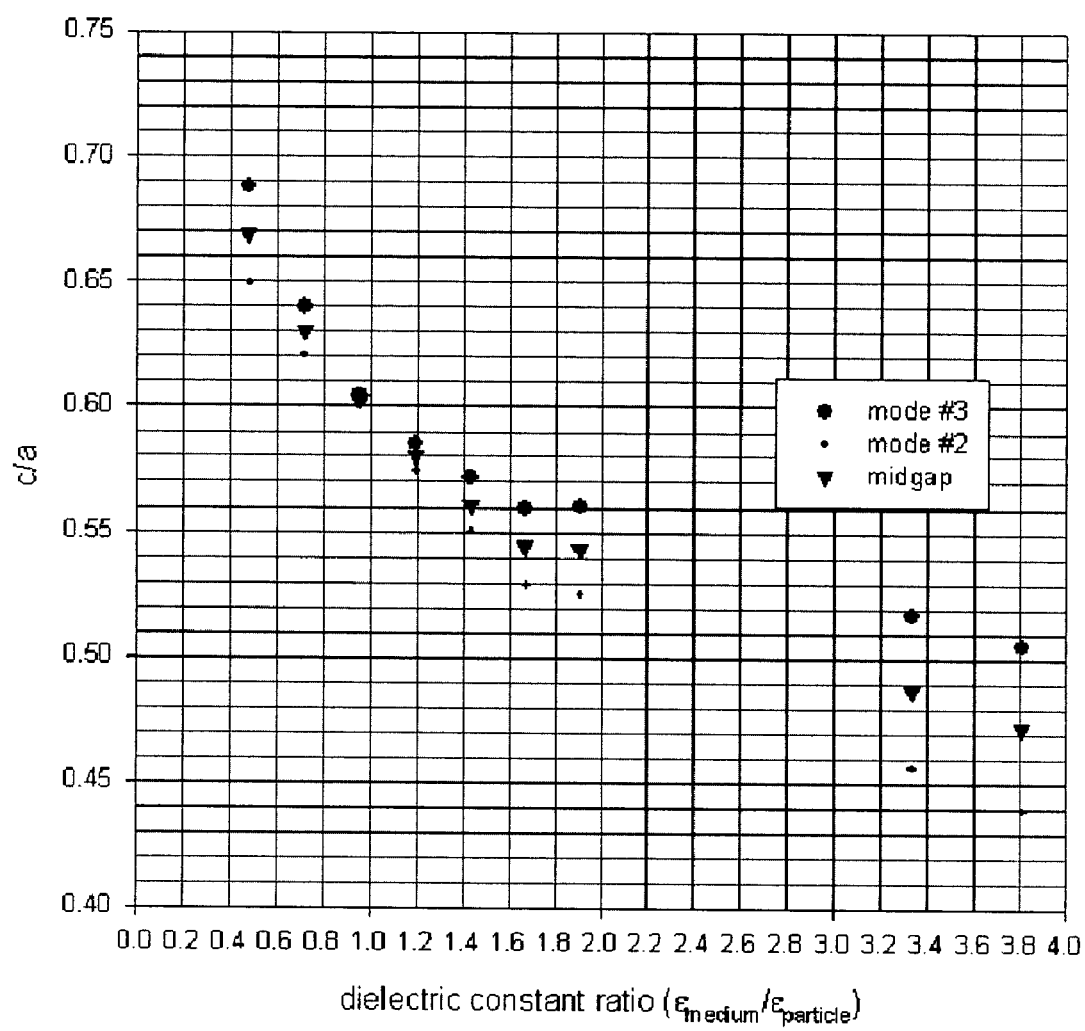
FIG. 4 shows a result of a calculation of a dimensionless frequency change of a mid-gap and a photonic band gap (mode 2 and mode 3) in a [111] direction, according to the dielectric contrast of materials filled in the spaces between silica colloidal crystals and particles.

FIG. 4 shows the calculated dimensionless frequency change of a mid-gap and a photonic band gap (frequency area between mode 2 and mode 3) in a [111] direction, according to the dielectric contrast of materials filled in the spaces between the colloidal crystals and the particles. As shown in FIG. 4, in cases where the polymer materials are filled between the interstices of particles, a variety of refractive indexes can result. As such, variable positions of the photonic band gaps may be theoretically expected.

As described above, the present invention provides a method of preparing patterned colloidal crystals, characterized in that colloidal crystalline regions oriented in the same direction with different refractive indexes can be controlled in the level of μm, and repeated patterns can be inexpensively and easily prepared. To further control the refractive index, patterns in the level of μm may be additionally formed at an unpolymerized region through other organic polymerizations or inorganic reactions.

The inventive method is advantageous in terms of the controllable optical properties of the colloidal crystals, for example, photonic band gaps, whereby end products can be used for panels having high reflectibility of reflective microdisplays.

The present invention has been described in an illustrative manner, and it is to be understood that the terminology used is intended to be in the nature of description rather than of limitation. Many modifications and variations of the present invention are possible in light of the above teachings.

Therefore, it is to be understood that within the scope of the appended claims, the invention may be practiced otherwise than as specifically described.

What is claimed is:

1. A method of preparing patterned colloidal crystals, the method comprising:
    filling a monomer solution into interstices of colloidal crystals for photopolymerization inside them; and
    performing a selective photopolymerization process in the interstices of colloidal crystals by use of a mask.

2. The method as defined in claim 1, wherein the monomer solution for the photopolymerization comprises an acrylate monomer.

3. The method as defined in claim 2, wherein the acrylate monomer is selected from the group consisting of hydroxypropyl methacrylate, hydroxyethyl methacrylate, methacrylate, or mixtures thereof.

4. The method as defined in claim 1, wherein the colloidal crystals each comprise at least one selected from the group consisting of polystyrene, polymethyl methacrylate, polyphenyl methacrylate, polyacrylate, polyalphamethylstyrene, poly1-methylcyclohexyl methacrylate, polycyclohexyl methacrylate, polybenzyl methacrylate, polychlorobenzyl methacrylate, poly1-phenylcyclohexyl methacrylate, poly1-phenylethyl methacrylate, polyperfuryl methacrylate, poly1,2-diphenylethyl methacrylate, polypentabromophenyl methacrylate, polydiphenylmethyl methacrylate, polypentachlorophenyl methacrylate, copolymer of methyl methacrylate and benzyl methacrylate, copolymer of styrene and acrylonitrile, copolymer of methyl methacryalte and 2,2,2-trifluoroethyl methacrylate, copolymer of methyl methacryalte and 2,2,3,3,3-pentafluoropropyl methacrylate, copolymer of methyl methacryalte and 1,1,1,3,3,3-hexafluoroisomethacrylate, copolymer of methyl methacryalte and 2,2,3,3,4,4,4-heptafluorobutyl methacrylate, copolymer of 2,2,2-trifluoroethyl methacrylate and 2,2,3,3,3-pentafluoropropyl methacrylate, copolymer of 2,2,2-trifluoroethyl methacrylate and 1,1,1,3,3,3-hexafluoroisomethacrylate, copolymer of styrene and methyl methacrylate, and copolymer of 2,2,2-trifluoroethyl methacrylate and 2,2,3,3,4,4,4-heptafluorobutyl methacrylate.

5. The method as defined in claim 1, wherein the colloidal crystals each comprise at least one selected from the group consisting of $SiO_2$, $TiO_2$, $ZnS$, $ZnO_2$, and $Fe_3O_4$.

6. The method as defined in claim 1, wherein light for use in the polymerization is selected between ultraviolet ranges and visible ranges.

7. A method of preparing patterned colloidal crystals, the method comprising:
    filling a first monomer solution for photopolymerization between planar colloidal crystals;
    performing a first selective photopolymerization process between the colloidal crystals by use of a mask, to prepare firstly patterned colloidal crystals; and
    filling a second monomer solution for photopolymerization between the firstly patterned colloidal crystals, followed by performing at least one photopolymerization process between the firstly patterned colloidal crystals by use of an additional mask.

8. The method as defined in claim 7, wherein the first monomer solution or the second monomer solution for the photopolymerization comprises an acrylate monomer.

9. The method as defined in claim 8, wherein the acrylate monomer is selected from the group consisting of hydroxypropyl methacrylate, hydroxyethyl methacrylate, methacrylate, or mixtures thereof.

10. The method as defined in claim 7, wherein the colloidal crystals each comprise at least one selected from the group consisting of polystyrene, polymethyl methacrylate, polyphenyl methacrylate, polyacrylate, polyalphamethylstyrene, poly1-methylcyclohexyl methacrylate, polycyclohexyl methacrylate, polybenzyl methacrylate, polychlorobenzyl methacrylate, poly1-phenylcyclohexyl methacrylate, poly1-phenylethyl methacrylate, polyperfuryl methacrylate, poly1,2-diphenylethyl methacrylate, polypentabromophenyl methacrylate, polydiphenylmethyl methacrylate, polypentachlorophenyl methacrylate, copolymer of methyl methacrylate and benzyl methacrylate, copolymer of styrene and acrylonitrile, copolymer of methyl methacryalte and 2,2,2-trifluoroethyl methacrylate, copolymer of methyl methacryalte and 2,2,3,3,3-pentafluoropropyl methacrylate, copolymer of methyl methacryalte and 1,1,1,3,3,3-hexafluoroisomethacrylate, copolymer of methyl methacryalte and 2,2,3,3,4,4,4-heptafluorobutyl methacrylate, copolymer of 2,2,2-trifluoroethyl methacrylate and 2,2,3,3,3-pentafluoropropyl methacrylate, copolymer of 2,2,2-trifluoroethyl methacrylate and 1,1,1,3,3,3-hexafluoroisomethacrylate, copolymer of styrene and methyl methacrylate, and copolymer of 2,2,2-trifluoroethyl methacrylate and 2,2,3,3,4,4,4-heptafluorobutyl methacrylate.

11. The method as defined in claim 7, wherein the colloidal crystals each comprise at least one selected from the group consisting of $SiO_2$, $TiO_2$, $ZnS$, $ZnO_2$, and $Fe_3O_4$.

12. The method as defined in claim 7, wherein light for use in the polymerization is selected between ultraviolet ranges and visible ranges.

* * * * *